United States Patent [19]

Yarwood et al.

[11] 4,325,777

[45] Apr. 20, 1982

[54] METHOD AND APPARATUS FOR REFORMING AN IMPROVED STRIP OF MATERIAL FROM A STARTER STRIP OF MATERIAL

[75] Inventors: John C. Yarwood, Madison; Derek E. Tyler, Cheshire; Joseph Winter, New Haven, all of Conn.

[73] Assignee: Olin Corporation, New Haven, Conn.

[21] Appl. No.: 178,063

[22] Filed: Aug. 14, 1980

[51] Int. Cl.³ ............................................. C30B 13/18
[52] U.S. Cl. ..................................... 156/620; 422/250
[58] Field of Search ....... 422/250; 156/620, DIG. 88, 156/DIG.73; 164/49, 60

[56] References Cited

U.S. PATENT DOCUMENTS

| | | | |
|---|---|---|---|
| 2,855,335 | 10/1958 | Seiler et al. | 156/620 |
| 3,467,166 | 9/1969 | Getseler et al. | 164/49 |
| 3,585,088 | 6/1971 | Schwultke et al. | 156/DIG. 80 |
| 4,161,206 | 7/1979 | Yarwood et al. | 164/49 |
| 4,242,553 | 12/1980 | Berkman | 156/608 |

FOREIGN PATENT DOCUMENTS 1154950  6/1958  Fed. Rep. of Germany ...... 422/250

OTHER PUBLICATIONS

Morrison Scale Up of Program on Continuous Solar Cells, National Technical Information Service Report PB–248963 9/75.
Crawford Dunlap Jr. Introduction for Semiconductors, 1957 pp. 206–223.
Zone Melting Pfann, Wiley, 1958, p. 74–97.
Laser Growth of Silicon Ribbon, Gurtler et al., Laser Applications in Materials Processing, Soc. Photo-Optical Inst. Eng., 1980, pp. 128–132.

*Primary Examiner*—Hiram Bernstein
*Attorney, Agent, or Firm*—Howard M. Cohn; Paul Weinstein

[57] ABSTRACT

A process and apparatus for reforming an improved strip (12) of material from a starting strip (16) of material. An electromagnetic device (18) maintains a floating molten zone (20) of the material in the starting strip (16) of the material and also forms the floating zone into the improved strip (12). The apparatus is provided with a susceptor device (80) arranged adjacent to the starting strip and operatively associated with the electromagnetic device (18) for initially heating the starting strip to be sufficiently conductive so that the starting strip can be directly heated by the electromagnetic device. Further, a control device (67) provides relative movement between the susceptor device (80) and the electromagnetic device by positioning the susceptor device in and out of the field of the electromagnetic device.

26 Claims, 10 Drawing Figures

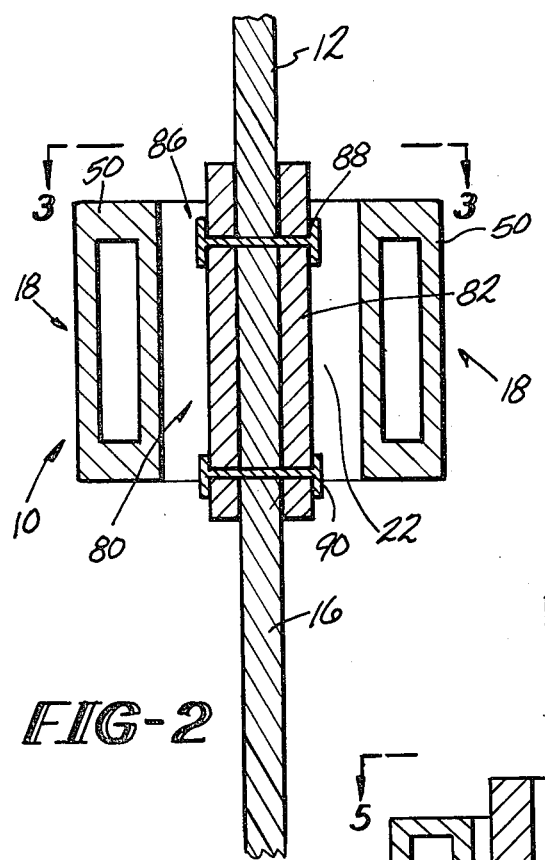
FIG-2
FIG-2A
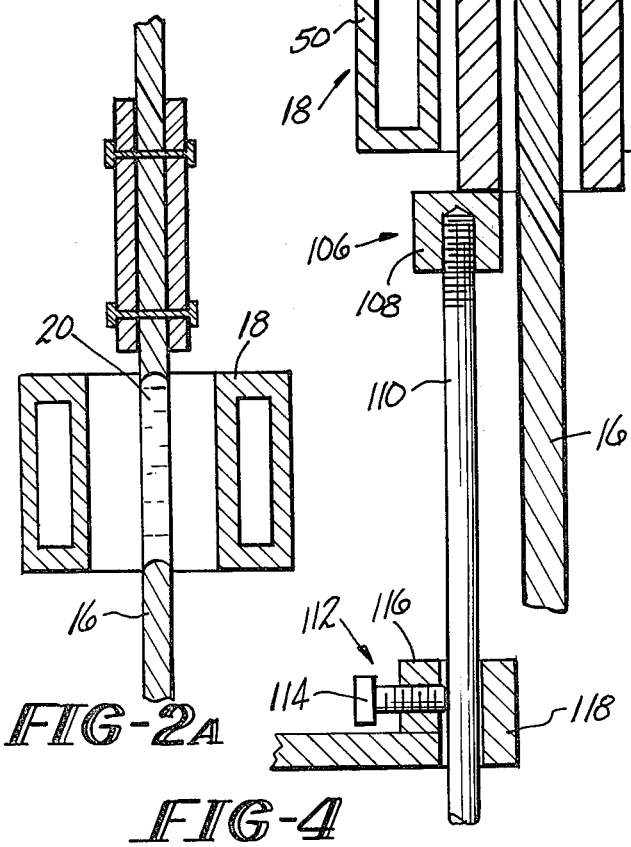
FIG-4
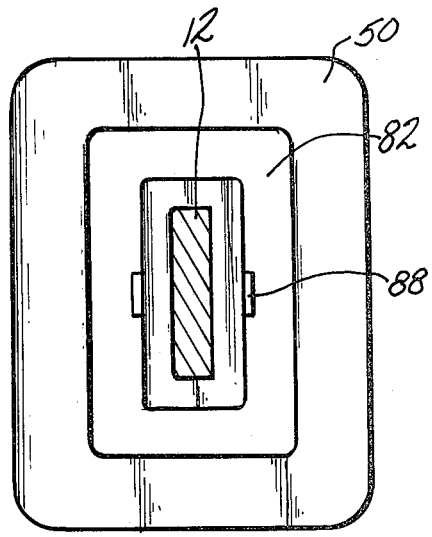
FIG-3
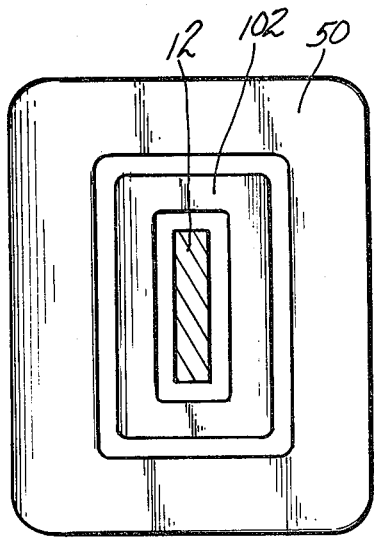
FIG-5

METHOD AND APPARATUS FOR REFORMING AN IMPROVED STRIP OF MATERIAL FROM A STARTER STRIP OF MATERIAL

While the invention is subject to a wide range of applications, it is especially suited for use in electromagnetic reforming of strip material and will be particularly described in that connection. The method and apparatus is preferably used for initially heating a starter strip of material such as a semi-conductor to a temperature where an electromagnetic field can heat the strip into a floating molten zone.

In the past, the electromagnetic reforming of thin strip semi-conductive materials from a starter strip of the material has encountered an inherent difficulty in providing the initial heat transfer to the thin starter strip. The resistivity of the semi-conductor, significantly below the melting point, is such that the penetration depth of the electromagnetic field from the inductive heater does not accord a satisfactory coupling between the inductor and the thin semi-conductor starter strip. The result is that direct melting by this technique is very difficult and often impossible.

A variety of processes have been developed for forming semi-conductive materials such as silicon into a thin strip shape. Examples of such approaches can be found in National Technical Information Service Report PB-248963 "Scale Up of Program on Continuous Silicon Solar Cells" by A. D. Morrison, published in September 1975, and a paper entitled "The Role of Surface Tension in Pulling Single Crystals of Controlled Dimensions" by G. K. Gaule et al. from Metallurgy of Elemental and Compound Semiconductors, published by Interscience Publishers, Inc., New York in 1961, pages 201–226. The Morrison publication is exemplary of the state of the art with respect to the pulling of strip-type materials from a melt of silicon. The Gaule et al. publication is similarly exemplary and of particular interest insofar as it discloses the use of electromagnetic forces for applying external pressure at the growth interface.

A considerable body of art has developed with respect to the use of electromagnetic containment for the purposes of casting metals. These electromagnetic casting apparatuses comprise a three-part mold consisting of a water cooled inductor, a non-magnetic screen, and a manifold for applying cooling water to the resultant casting. Such an apparatus is exemplified in U.S. Pat. No. 3,467,166 to Getselev et al. Containment of the molten metal is achieved without direct contact between the molten metal and any component of the mold. Solidification of the molten metal is attained by the direct application of water from a cooling manifold to the solidifying shell of the casting. An elaborate discussion of the prior art relating to electromagnetic casting is found in U.S. Pat. No. 4,161,206 to Yarwood et al. That prior art statement is intended to be incorporated by reference herein. The Yarwood et al. patent deals with a control system for controlling the electromagnetic process which is believed to have particular use in the apparatus of the present invention.

In U.S. Patent Application, Ser. No. 139,617, filed Apr. 11, 1980 by M. J. Pryor, an electromagnetic thin strip casting apparatus and process is described which is adapted for forming thin strip castings of a variety of materials including semi-conductive materials such as silicon. In this apparatus, a specially-shaped inductor is utilized for containing a funnel-shaped pool of molten material and for forming the material into the desired thin strip shape. The process can be carried out continuously or semi-continuously as desired.

In U.S. Patent Application, Ser. No. 158,040, filed June 9, 1980 by J. Winter, an electromagnetic thin strip reforming apparatus and process is described which is adapted for forming thin strip castings of a variety of materials including semi-conductive materials such as silicon. In this apparatus, an input device conveys the starting strip of material to the electromagnetic apparatus to form the floating molten zone and an output device conveys thin strip of the material away from the electromagnetic device. The starting strip is preferably initially heated by the inductor, which forms the floating molten zone, but may be accomplished by a separate housing source such as another inductor or a laser. The apparatus in this U.S. application is incorporated by reference herein.

It is an object of the present invention to provide an apparatus and process for reforming an improved strip of material from a starting strip of material which substantially obviates one or more of the limitations and disadvantages of the described prior arrangement.

It is a further object of the present invention to provide an apparatus and process for reforming an improved strip of material from a starting strip of material wherein the starting strip is initially heated by means of a heating device operatively associated with an electromagnetic casting apparatus.

It is a still further object of the present invention to provide an apparatus and process for reforming an improved strip of material from a starting strip of material wherein a susceptor is provided in conjunction with an electromagnetic casting apparatus for initially heating a starter strip of material.

It is a still further object of the present invention to provide an apparatus and process for reforming an improved strip of material from a starting strip of material wherein the material is a semi-conductor such as silicon.

It is a yet further object of the present invention to provide an improved apparatus and process for reforming an improved strip of material from a starting strip of material in a manner which is relatively inexpensive to manufacture and operate.

Accordingly, there has been provided a process and apparatus for reforming an improved strip of material from a starting strip of material. An electromagnetic device maintains a floating molten zone of the material in the starting strip of the material and forms the floating zone into the improved strip. The apparatus is provided with a susceptor device arranged adjacent to the starting strip and operatively associated with the electromagnetic device for initially heating the starting strip to be sufficiently conductive so that the starting strip can be directly heated by the electromagnetic device. A control device provides relative movement between the susceptor and the electromagnetic device by positioning the susceptor in and out of the field of the electromagnetic device. The susceptor is located adjacent to the starting strip for coupling with the electromagnetic device is initially heat the starting strip. In one embodiment the susceptor is affixed directly to the starting strip, and in another embodiment the susceptor is spaced from the starting strip.

For a better understanding of the present invention, together with other and further objects thereof, reference is had to the following description, taken in connection with the accompanying drawings, while its scope will be pointed out in the appended claims.

FIG. 2 is a schematic illustration showing a first embodiment of the apparatus of the present invention.

FIG. 2A is a schematic illustration showing the first embodiment of the present invention with the susceptor moved out of the electromagnetic field.

FIG. 3 is a view through 3—3 of FIG. 2.

FIG. 4 is a schematic illustration showing an alternative embodiment of this invention.

FIG. 5 is a view through 5—5 of FIG. 4.

Figure 1:
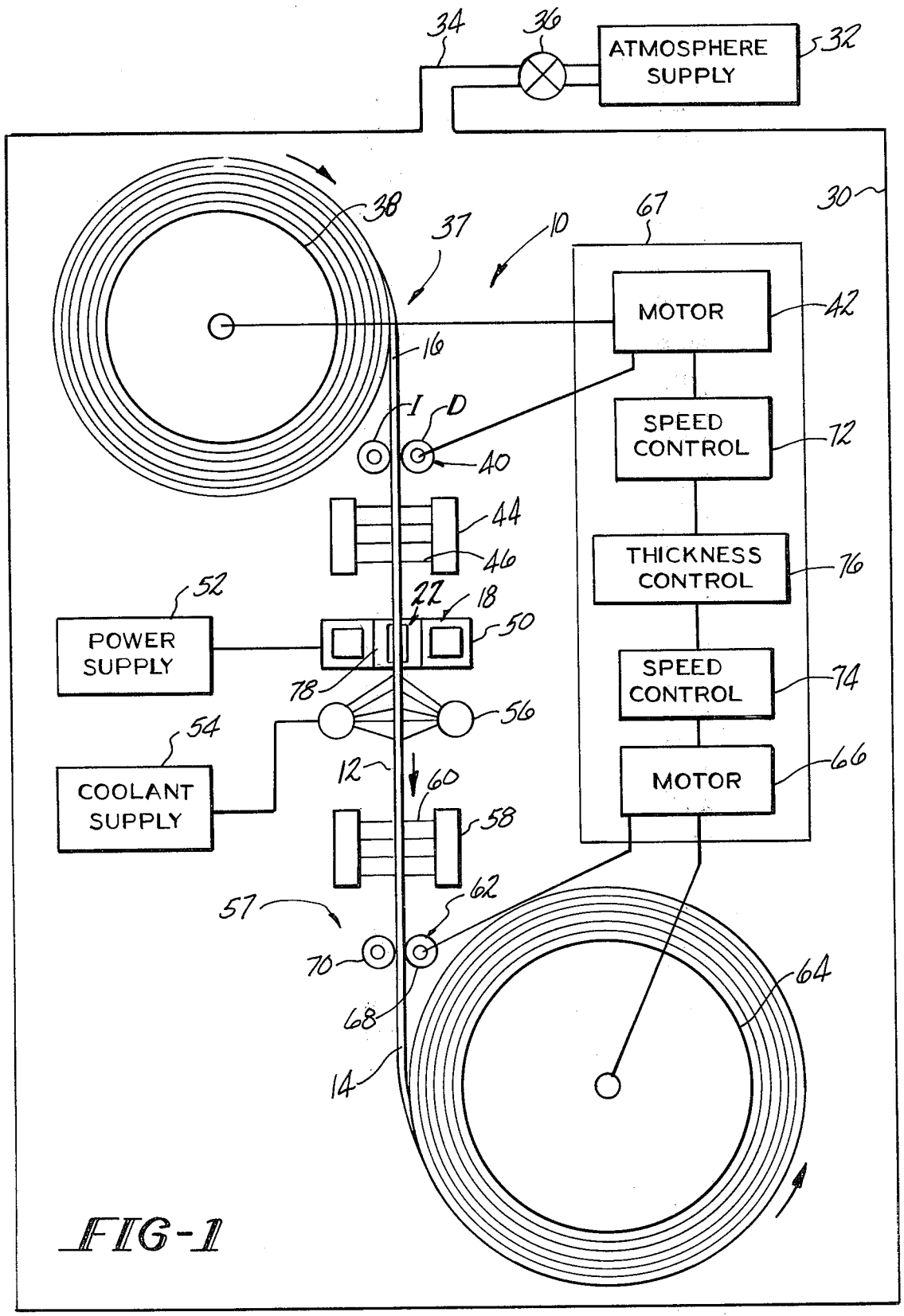
FIG. 1 is a schematic illustration showing the environment in which the present invention is preferably employed.

An apparatus 10 is provided for reforming an improved strip 12 of a material 14 from a starting strip 16 of the material. An electromagnetic device 18 maintains a floating molten zone 20 of the material 14 in the starting strip 16 of the material and also forms the floating molten zone into the improved strip 12. The improvement is the addition of a susceptor device 80 arranged adjacent to the starting strip and operatively associated with the electromagnetic device 18 for initially heating the starting strip to be sufficiently conductive so that the starting strip can be directly heated by the electromagnetic device.

Referring now to FIG. 1, there is shown by way of example an electromagnetic reforming apparatus of this invention.

In accordance with this invention, a process and apparatus is provided for initially melting a starting strip of material whereby ultra-thin strip cross sections are provided from the starting strip material. The resulting ultra-thin strip has improved microstructure and improved dimensional uniformity. The present invention may be adapted for use with a starting material in the form of ribbon or strip, preferably available in long coils. The starting strip can be obtained by casting as in accordance with the Pryor application mentioned in the background of this case; from metal powder compressed and sintered to yield coils of sufficient integrity to be handled; from ribbon strip produced by the high solidification rate amorphous strip processes; from strip produced by the crystal pulling techniques as in the Morrison article or from strip produced by any other desired method.

Referring now to FIG. 1, an apparatus 10, of the type disclosed in the Winter application mentioned in the background of this application, is shown. Apparatus 10 is adapted for carrying out the process of the present invention. The apparatus 10 shown is contained within an atmosphere controlled chamber 30 whereby it is possible to perform the process in a desired atmosphere which will reduce the possibility of contamination. A suitable atmosphere could comprise argon gas. However, any desired atmosphere could be utilized. The atmosphere is provided from a suitable atmosphere supply 32 which is connected to the processing chamber 30 by conduit 34 and valve 36. The atmosphere supply 32 can be of conventional design and does not form a part of the present invention.

Within the processing chamber is a device 37 for providing relative movement between strip 16 and electromagnetic device 18. Device 37 may consist of a first payoff reel 38 of the starting strip 16 and a first capstan drive 40 adjacent the payoff reel 38 for controlling the rate of speed at which the starting strip material 16 is paid off the payoff reel 38. The capstan drive 40 may be gear driven by motor 42 whose speed may be controlled in a manner which will be briefly described later. The capstan drive 40 comprises opposed driven D and idling I pinch rolls. The payoff reel 38, which may also be gear driven by motor 42 through a slip clutch (not shown) at a relatively slower speed than the capstan drive 40, advances the strip 16 to provide a slight tension on the strip 16 between the payoff reel 38 and the capstan drive 40. The strip 16 from the payoff coil is threaded through the nip of the capstan drive rolls 40 and then through a first guide device 44 which is adapted to guide the strip 16 into the electromagnetic processing station 18 of the present invention. The guide device 44 may be of any conventional design such as for example rollers, slides, or brushes 46 as shown.

The strip 16 is then forwarded through the electromagnetic containment and melting station 18 in accordance with the present invention. It is preferred in accordance with this invention that the electromagnetic containment and melting station comprise an inductor 50 which is powered by supply 52 in a manner so as to both aid in heating and melting the incoming strip 16 to form the floating molten zone and also to contain and form the molten material into the desired strip cross section. The initial heating and melting of the starter strip 16 is the primary aspect of the present invention and will be more fully explained hereinbelow.

A suitable coolant from supply 54 may be applied by spray manifold 56 to the resulting strip 12 after passing through the containment inductor 50. The coolant may comprise any desired coolant material such as argon gas or water, and it can be gaseous or liquid as desired. The use of an inert gas is suitable when the rate at which the strip 12 is advanced is relatively slow as might be the case for single crystal growth. The use of water is more suited to high speed travel of the strip.

The solidified strip is then passed through an output device 57 for conveying the improved strip 12 from the inductor which may consist of a guide device 58, a capstan drive 62, and a takeup reel 64. The guide device 58 may be constructed of brushes 60 in a manner similar to that of the first guide means 44.

The second capstan drive 62 is arranged adjacent the takeup reel 64 for controlling the rate of speed at which the resulting strip material 12 is withdrawn from the containment station 18. The capstan drive 62 may be gear driven by motor 66 whose speed may be controlled in a manner which will be briefly described below. The capstan drive 62 also comprises opposed driven 68 and idling 20 pinch rolls. The strip 12 is threaded through the nip of the capstan drive rolls 62 and then onto the takeup reel 64. The takeup reel 64 may also be gear driven by motor 66 through a slip clutch (not shown) at a relatively higher speed than the capstan drive 62 advances the strip 12 to thereby provide a slight tension on the strip 12 between the takeup reel 64 and the capstan drive 62.

For brittle materials, such as silicon, the reels 38 and 64 may be relatively large in diameter so as not to exceed the flexibility of material. However, with thin strip materials to which this invention is principally applicable, it is possible to coil and uncoil even brittle materials on large diameter reels 38 and 64. Generally, the starting strip thickness is about 0.1 inches or less and most preferably less than about 0.075 inches and most preferably about 0.040 inches.

The thickness of the resulting strip 12 is a function of the rate at which the incoming strip 16 is fed to the melting and containment station 18 and the exiting solidifying strip 12 is withdrawn from that station 18. These rates are controlled by a control device 67 including the aforenoted motors 42 and 66 and capstan drives whose speed is in turn controlled by a conventional speed control 72 or 74, respectively. The speed controls 72 or 74 may in turn be actuated by a thickness control system 76 which is part of the control device 67. The operation of the aforementioned apparatus 10 is more fully explained in the application to Winter referenced above.

Referring now to FIG. 2, there is shown a first embodiment of the apparatus of the present invention. An electromagnetic device 18, as mentioned above in reference to FIG. 1, includes an inductor 50. The inductor 50 is excited by an alternating current from a power supply and control system 52 which may be of any desired design. However, preferably it is in accordance with the teachings of U.S. Pat. No. 4,161,206 to Yarwood et al. In that approach, current in the inductor 50 is controlled in a manner so as to maintain the inductance of the inductor 50 substantially constant. This insures a uniform air gap being maintained between the molten material 20 and the surrounding inductor as a melting run proceeds.

The alternating current in the inductor 50 produces a magnetic field which interacts with the material in the floating molten zone 20 to produce eddy currents therein. These eddy currents in turn interact with the magnetic field and produce forces which apply a magnetic pressure to the molten material 20 to contain it so that it solidifies in a desired cross section corresponding about to the cross section of the inductor 50. An air gap exists during melting and solidification between the molten material 20 and the inductor 50. The molten material 20 is formed or molded in the solidification zone 78 into the same general shape as in the inductor 50 thereby providing the desired improved strip cross section. The inductor 50 preferably has a rectangular shape which surrounds the molten material in order to obtain the desired thin strip cross section.

In order to heat the starter strip 16 as it enters the electromagnetic device 18, a heating device 22 is provided. The heating device includes an inductor 80 and is operatively associated with the electromagnetic device 18 for initially heating the starter strip whereby the floating molten zone 20 as seen in FIG. 2A can be formed. As previously mentioned, the susceptor device is required because the inductors used to maintain the floating molten zone of the semi-conductor strip, herein referred to as the silicon strip, produce an electromagnetic field whose penetration depth at room temperature into pure solid silicon is in the order of one meter. Accordingly, very poor coupling between the inductor and the thin silicon strip load results. To overcome this problem, the susceptor device 80 has been added to the system to operate in conjunction with the inductor.

The susceptor device 80 is located adjacent to the starting strip 12 for coupling with the electromagnetic device to initially heat the starting strip. The susceptor device preferably surrounds the starting strip and is interposed between the electromagnetic device and the starting strip. The susceptor is typically made of a refractory metal such as for example molybdenum (Mo), tantalum (Ta), or hafnium (Hf). Each of these metals is chosen to have a melting point which is considerably higher than a semi-conductor such as silicon which may form the starting strip of material being melted. In addition, the electrical properties of these metals at high temperature are generally similar and in the approximate range as the electrical properties of liquid silicon at its melting point as indicated in the chart below.

| Element | Condition | Temp. (°C.) | Resistivity ($\mu\Omega$-cm) |
|---|---|---|---|
| Si | liquid | 1412 | ~80 |
| Mo | solid | 1500 | ~46 |
| Ta | solid | 1500 | ~71 |
| Hf | solid | 1400 | ~80 |

Since the resistivity of these metals is relatively close to the resistivity of liquid silicon, the same inductor which maintains a floating molten zone of the silicon in the starting strip and forms the floating molten zone into the improved strip may be used to heat the susceptor in order to initially heat the starting strip whereby the floating molten zone can be formed.

In order to achieve a highly efficient heating of the solid silicon, it is desirable to provide a susceptor of a thickness which is able to radiate and/or conduct the maximum amount of heat given the selected frequency of the inductor which is used for maintaining the floating molten zone and forming the improved strip. This thickness is approximately two times the penetration depth of the susceptor when the susceptor is shaped to surround the starting strip.

The penetration depth is given by the following formula:

$$\delta = \sqrt{\frac{\tau}{\mu_o \pi f}}$$

In the above formula $\delta$ = penetration depth. $\delta$ comprises the depth of the material in question through which the current density has an approximate exponential decay of about 63% as compared to the current at the outer peripheral surface. $\tau$ = the resistivity of the material being cast. $\mu_o$ = the permeability of the material being cast. $f$ = the frequency of the applied current. $\pi$ = 3.14.

It should be noted that $2\delta$ comprises the depth of the material through which the current has an approximate exponential decay of about 86% as compared to the current at the outer peripheral surface. Thus, if the thickness of the susceptor is increased to be much more than $2\delta$, the susceptor may not be able to heat up to its maximum potential and a longer period of time will be required in order to initially melt the starting strip. On the other hand, if the susceptor has a width of less than twice the penetration depth, it will not be able to absorb all of the electromagnetic field and will, therefore, not make the most efficient use of the field.

An important aspect of the susceptor is that it is constructed of a material with a much higher melting point than that of the semi-conductor which is being formed into an improved strip. Therefore, the susceptor is able to retain sufficient mechanical properties at the temperature which it is being heated to maintain its shape and also to sustain some loading if required. Although a few materials that would be appropriate to act as a susceptor have been mentioned herein, it is within the scope of the present invention to preferably form the susceptor of any desired conductor which has both a somewhat higher melting point than the material of the improved strip and a resistivity which is similar to the liquid material of the improved strip at its melting point.

As illustrated in FIGS. 2 and 3, the susceptor device 80 may be interposed between the electromagnetic device 18 and the starting strip 16. More specifically, the susceptor device 80 is formed of a sleeve of metal 82 which may surround the starting strip. The sleeve has an inner cross-sectional shape conforming to the cross section of the thin strip. In the embodiment of FIGS. 2 and 3, the susceptor device is contiguous with the starting strip.

Joining apparatus 86 is provided for affixing the susceptor device to the starting strip. An important consideration in choosing the joining apparatus is the prevention of mechanical failure due to the heat generated in the susceptor device. The joining apparatus may consist of rivets 88 and 90. It is also within the scope of the present invention to use any other desirable means for affixing the susceptor to the starting strip such as for example spot welding.

The length of the susceptor sleeve 82 is generally of the same order as the length of the inductor 50. In the illustrated embodiment, the susceptors are slightly longer than the length of the inductor in order to receive the maximum field from the inductor as well as to support the susceptor against a solid portion of the starting strip 16 and the improved strip 12 in the event that sections of the starting strip in the area of the susceptor becomes very soft. However, it is within the scope of the present invention to provide a susceptor which is shorter than the length of the inductor. In addition, although the sleeve has a generally rectangular cross section, it is within the scope of the present invention to form the sleeve 82 with any desired cross section.

The susceptor device also includes a control device 67 of the type described and shown in FIG. 1 for positioning the susceptor and starting strip within the inductor to initially heat the starting strip to a temperature where the starting strip can be directly heated by the electromagnetic field. The control device then removes the susceptor device from the inductor after the starting strip is initially heated as shown in FIG. 2A. This control device 67 may operate by the turning of the reels moving the starter strip through the inductor. It is also within the scope of the present invention to use any other type of control device which can move the susceptor 80 out of the field of the inductor 50.

Figure 6:
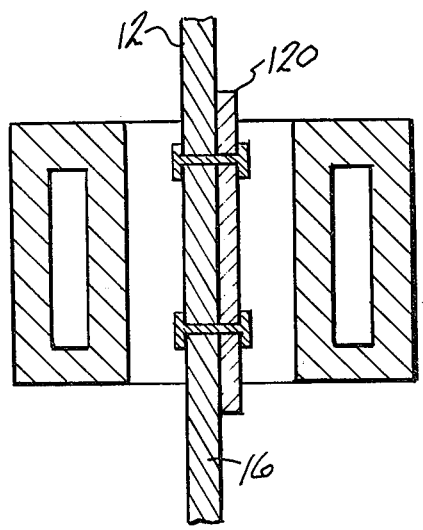
FIG. 6 is a schematic illustration showing an alternative embodiment using a susceptor on one side of a starting strip.

The susceptor may also be formed of a single strip of susceptor metal 120 attached to the starting strip 12. In this construction as shown in FIG. 6, the susceptor is preferably of a thickness of approximately 4δ to absorb the maximum electromagnetic field. This extra width is suitable because the electromagnetic field enters the susceptor from both sides because of the lack of an opposing susceptor strip to absorb the field as previously described.

Figure 7:
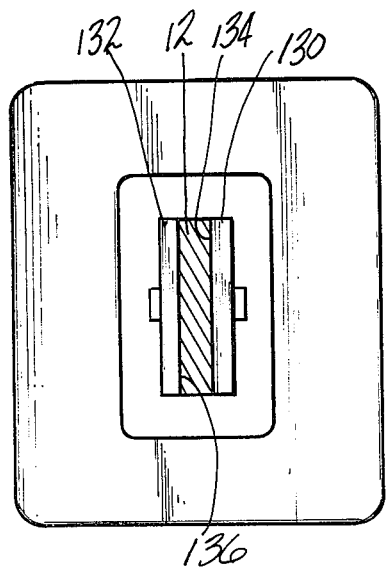
FIG. 7 is a top view of a schematic illustration showing an alternative embodiment using a susceptor on only two sides of a starter strip.

Another possible configuration as shown in FIG. 7 is two susceptor strips 130 and 132 located on both wide sides 134 and 136, respectively, of the starting strip 12 and aligned with each other. In this case the strips may have a thickness of approximately 2δ since the current field is not provided at the edges of the susceptor strips as in the sleeve configuration shown in FIG. 3.

Although the susceptor strip preferably is formed with a constant thickness and a rectangular configuration to conform to the side wall of the starting strip, it is within the scope of the present invention to form the susceptor with a varying thickness and in any shape as desired.

In order to more fully understand the present invention, a description of its operation follows. A susceptor is placed around a starter strip of material and joined thereto by any suitable means such as the rivets shown in FIG. 2. The susceptor and starting strip are then positioned in the electromagnetic field of the inductor 50 either manually, or in the case of an apparatus 10 as shown in FIG. 1, by the control device 67. The susceptor may be in the electromagnetic field without being in the confines of the inductor. The electromagnetic field of the inductor supplementally heats the susceptor for initially heating the starter strip to a temperature where the starting strip can be directly heated by the electromagnetic field of the inductor. This occurs by the susceptor material being coupled with the electromagnetic field whereby the inductive current heats the susceptor. The heat is transferred to the starting strip of silicon by a combination of heat conduction and radiation. After the starting strip has been heated from between approximately 800° C. up to near its melting point, the supplemental heating is moved from the electromagnetic field as illustrated in FIG. 2A. Relative movement between the starting strip and the electromagnetic field is provided by control device 67 and may function to position the susceptor in the field of the inductor, move the susceptor out of the field, convey the starting strip of material to the floating zone, and convey the improved strip from the floating molten zone. This relative movement can be accomplished by the turning of the reels 38 and 64. The initially heated strip may now be coupled directly with the electromagnetic field of the inductor to heat up to form a floating molten zone 20. This may be accomplished by increasing the current of the inductor 50 until the molten zone is formed. At that point, the inductor is adjusted to maintain a floating molten zone of the material. As the solid strip is fed into the field of the inductor, the existing molten zone in conjunction with the electromagnetic field melts the incoming strip 16 as it is advanced into the melting and containment zone 18. The floating molten zone is then electromagnetically formed into the improved strip as generally explained hereinabove and in greater detail in the Winter application.

Referring to FIGS. 4 and 5, there is illustrated another embodiment of the invention. The structural aspects of FIGS. 4 and 5, which are identical to the structure of FIGS. 2 and 3, have the same numerical designation. A susceptor device 100 includes a sleeve of conductor material 102 which may be a metal of the type described hereinabove. The susceptor 102 surrounds the starting strip 16 and is interposed and spaced between the electromagnetic device 18 and the starting strip. As in the embodiment, the susceptor may be formed from a single strip adjacent the starting strip or two opposed strips on either side of the starting strip. Also, the length of the susceptor is a matter of design as in the first embodiment.

The susceptor device 100 includes a susceptor control device 106 for positioning the susceptor between the inductor and the starting strip before the starting strip is initially heated and removing the starting strip after it is at the desired temperature. This control device may include a joining element 108 which is affixed to one end of the two susceptor sleeves 102. The control device may comprise a rod element 110 which is affixed at one end of the susceptor for positioning and removing the susceptor. The rod may be affixed by being threaded into the joining element 108. Although a rod device is disclosed, it is within the scope of the invention to use any other desired mechanism to move the susceptor, such as for example a rack and pinion. The susceptor control device 106 also includes a locking element 112 for holding the rod 110 in any desired position. The locking element may consist of a screw 114 which is threaded through a hollow post 116 to push the rod against an inner surface 118 as is conventionally known in the art. It is also within the scope of the present invention to use any other type of locking element as desired.

The application of this embodiment of the invention is similar to the first embodiment of the invention as illustrated in FIG. 2. As described above, in order to initially heat the starting strip to a temperature where it can be coupled to the electromagnetic field, the susceptor is arranged adjacent to the starting strip and is operatively associated with the electromagnetic field of an inductor. This is accomplished by first placing the susceptor adjacent but without contact to the starting strip for coupling with the electromagnetic field to initially heat the starting strip. The susceptor is put into position by raising the susceptor with the rod 110 and locking it into place with the element 112. Although the susceptor is shown in FIG. 4 as being within the inductor 50, it is within the scope of the present invention to have the inductor only in the field of the inductor but not actually within the physical confines of the inductor. The inductor then heats up the susceptor which radiates heat to the starting strip until the latter is at least hot enough to be coupled to the electromagnetic field. At this point, the susceptor may be removed from the field by reversing the steps of positioning the susceptor control device. The inductor now forms the floating molten zone and continues melting and containment of the starting strip as described hereinabove.

Figure 8:
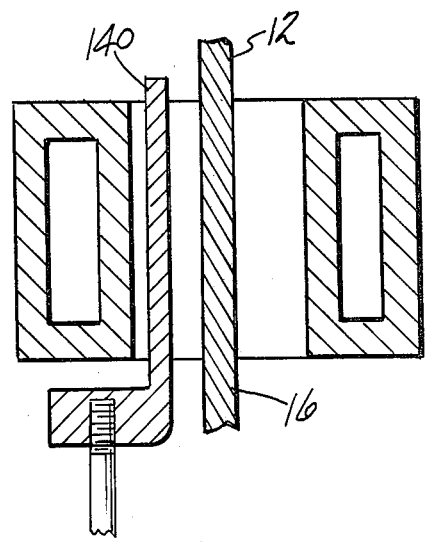
FIG. 8 is a side view of an embodiment having a single susceptor adjacent one side of a starting strip.

Another embodiment, as shown in FIG. 8, provides a single inductor 140 adjacent but not touching a starting strip 16. This configuration operates substantialy the same as the embodiment shown in FIG. 4.

Figure 9:
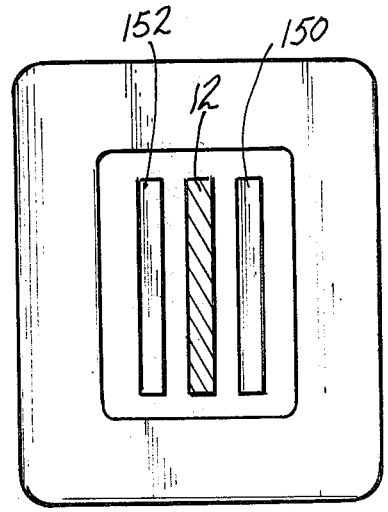
FIG. 9 is a top view of an embodiment having two susceptors placed adjacent two sides of a starting strip.

A further embodiment is shown in FIG. 9 wherein two susceptors 150 and 152 are positioned adjacent but not touching starting strip 12. This embodiment operates substantially as the configuration of FIG. 4.

Although the susceptor as shown in FIG. 2 moves into the bottom of the inductor, it is also within the scope of the present invention to initially position the susceptor so as to enter the inductor through the top surface.

While the strip has been described as moving upwardly, it can be moved in any desired direction. While vertical movement of the strip is preferred, the strip may be arranged to move along any desired orientation.

While the invention has been described generally by reference to semi-conductor materials, it may be adapted for use with various metals including copper and copper alloys, steel and steel alloys, aluminum and aluminum alloys, nickel and nickel alloys although other metals and alloys are not intended to be excluded. While the invention has been described with respect to the treatment of metalloids such as silicon or germanium, it is applicable to a wide range of such semi-metals which find applications in semi-conductor devices or solar cells including sapphire and compound semi-conductive materials such as galliumarsenide or the like. These materials are mentioned by way of example, and it is not intended to exclude other metalloids or semi-metal type materials finding application in electronic devices. Further, the materials may be doped or undoped as desired.

The U.S. patents set forth in this application are intended to be incorporated by reference herein.

It is apparent that there has been provided in accordance with this invention a process and apparatus for forming thin strip material which fully satisfies the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. In an apparatus for reforming an improved strip of material from a starting strip of material comprising:
   electromagnetic means for maintaining a floating molten zone of said material in said starting strip of said material and for forming said floating molten zone into said improved strip, the improvement wherein said apparatus includes:
   susceptor means arranged contiguous to the starting strip and operatively associated with said electromagnetic means for initially radiating and conducting heat to said starting strip whereby said starting strip is sufficiently conductive to be directly heated by said electromagnetic means, and
   means for providing relative movement between said susceptor means and said electromagnetic means by positioning said susceptor means in and out of the field of the electromagnetic means.

2. The apparatus of claim 1 wherein joining means are provided for affixing the susceptor means to the starting strip.

3. The apparatus of claim 1 wherein said susceptor means is interposed between the field of the electromagnetic means and said starting strip.

4. The apparatus of claim 3 wherein said susceptor means surrounds said starting strip.

5. The apparatus of claim 4 wherein said susceptor means is a sleeve of metal having an inner cross-sectional shape substantially conforming to the cross section of the starting strip.

6. The apparatus of claim 2 wherein said joining means is a rivet.

7. The apparatus of claim 2 wherein said joining means is a spot weld.

8. The apparatus of claim 1 wherein said electromagnetic means comprises an inductor.

9. The apparatus of claim 8 wherein said means for providing relative movement positions said susceptor means in the field of said inductor to initially heat said starting strip and removes said susceptor means from the field of said inductor after the starting strip is heated to the extent where it can be directly heated by the field of the inductor.

10. The apparatus of claim 8 wherein said susceptor means extends substantially the length of the inductor.

11. The apparatus of claim 1 wherein said susceptor means is a metal having a resistivity similar to the resistivity at the melting point of said starter strip of material.

12. The apparatus of claim 2 wherein said means for providing relative movement moves said starting strip into said electromagnetic means.

13. The apparatus of claim 12 wherein said means for providing relative movement includes input means for conveying said starting strip of said material to said electromagnetic means and output means for conveying said improved strip from said electromagnetic means.

14. The apparatus of claim 3 wherein said susceptor means is two strips of metal located on either side of the starting strip so that the strips of metal are aligned with each other.

15. The apparatus of claim 3 wherein said susceptor means is a strip of metal affixed against one side of the starting strip.

16. A process for reforming an improved strip of material from a starting strip of material comprising the steps of:
 positioning a susceptor contiguous to a starting strip in an electromagnetic field for initially radiating and conducting heat to the starting strip whereby the starting strip reaches a temperature so as to be sufficiently conductive to be directly heated by the electromagnetic field,
 moving said susceptor out of the electromagneitc field after the starting strip is initially heated,
 forming a floating molten zone in said initially heated starting strip with the electromagnetic field,
 forming said floating molten zone into said improved strip with said electromagnetic field.

17. The process of claim 16 including the step of placing a susceptor around said starting strip.

18. The process of claim 17 including the step of joining the susceptor to the starting strip.

19. The process of claim 16 including the step of providing relative movement between said starting strip and the electromagnetic field.

20. The process of claim 19 wherein the step of providing relative movement comprises conveying the starting strip of material to said floating molten zone.

21. The process of claim 20 wherein the step of providing relative movement comprises conveying the starting strip of material from the floating molten zone to form said improved strip.

22. The process of claim 16 including the step of placing a susceptor adjacent one side of the starting strip.

23. The process of claim 16 including the step of placing a susceptor adjacent opposite sides of the starting strip.

24. The process of claim 16 wherein said material is a semi-conductor.

25. The process of claim 24 wherein said semi-conductor is silicon.

26. The process of claim 16 wherein said susceptor is formed from a metal.

* * * * *

Disclaimer and Dedication 4,325,777.—*John C. Yarwood*, Madison; *Derek E. Tyler*, Cheshire, and *Joseph Winter*, New Haven, Conn. METHOD AND APPARATUS FOR REFORMING AN IMPROVED STRIP OF MATERIAL FROM A STARTER STRIP OF MATERIAL. Patent dated Apr. 20, 1982. Disclaimer and Dedication filed Apr. 27, 1982, by the assignee, *Olin Corp.*

Hereby disclaims and dedicates to the Public the remaining term of said patent.

[*Official Gazette June 29, 1982.*]